(12) United States Patent
Tsuji (10) Patent No.: US 7,955,650 B2
(45) Date of Patent: Jun. 7, 2011

(54) METHOD FOR FORMING DIELECTRIC FILM USING POROGEN GAS

(75) Inventor: Naoto Tsuji, Tama (JP)

(73) Assignee: ASM Japan K.K., Tokyo (JP)

( * ) Notice: Subject to any disclaimer, the term of this patent is extended or adjusted under 35 U.S.C. 154(b) by 965 days.

(21) Appl. No.: 11/759,439

(22) Filed: Jun. 7, 2007

(65) Prior Publication Data

US 2008/0305258 A1 Dec. 11, 2008

(51) Int. Cl.
*C23C 16/00* (2006.01)
(52) U.S. Cl. .......... 427/255.29; 427/248.1; 427/255.28; 427/8
(58) Field of Classification Search ............... 427/248.1, 427/372.2, 255.26, 255.27
See application file for complete search history.

(56) References Cited

U.S. PATENT DOCUMENTS

| | | | |
|---|---|---|---|
| 6,846,515 B2 | 1/2005 | Vrtis et al. | |
| 7,056,560 B2 * | 6/2006 | Yim et al. | 427/551 |
| 7,241,704 B1 * | 7/2007 | Wu et al. | 438/781 |
| 7,297,376 B1 * | 11/2007 | Yim et al. | 427/578 |
| 2006/0078676 A1 * | 4/2006 | Lukas et al. | 427/248.1 |

* cited by examiner

*Primary Examiner* — David Turocy
(74) *Attorney, Agent, or Firm* — Knobbe Martens Olson & Bear LLP (57) ABSTRACT

A method for reducing a dielectric constant of a cured film, includes: introducing a source gas at a flow rate of A, a porogen gas at a flow rate of B, an oxidizing gas at a flow rate of C, and an inert gas into a reaction space in which a substrate is place; increasing a ratio of B/(A+B) used as a parameter for controlling a dielectric constant of a cured film, by a degree substantially or nearly in proportion to a target decrease of dielectric constant of a cured film; applying RF power to the reaction space, thereby depositing a film on the substrate by plasma CVD; and curing the film to remove the porogen material, thereby forming pores in the cured film.

17 Claims, 4 Drawing Sheets

METHOD FOR FORMING DIELECTRIC FILM USING POROGEN GAS

BACKGROUND OF THE INVENTION

1. Field of the Invention

The present invention relates to a semiconductor technology in general. In particular, it relates to a method for forming on a semiconductor substrate a silicon insulation film offering low dielectric constant and achieving high material utilization by using a plasma CVD (chemical vapor deposition) apparatus.

2. Description of the Related Art

The demand for higher, more densely wired semiconductors in recent years is creating a need to reduce inter-wire volumes to prevent signal delays in devices that adopt multi-layer wiring technology. To reduce inter-wire volumes, it is necessary to reduce the dielectric constant of the insulation film formed between adjacent layers in a multi-layer wiring structure. Accordingly, development effort has been made to provide insulation films offering low dielectric constants.

The conventional silicon oxide film SiOx is formed by adding to a silicon material gas such as $SiH_4$ or $Si(OC_2H_5)_4$ an oxidizing agent being oxygen $O_2$, nitric oxide NO or nitrous oxide $N_2O$, and then heating or applying plasma energy to the mixture. The silicon oxide film obtained in this manner has heretofore offered a dielectric constant $\epsilon$ of approx. 4.0. On the other hand, the spin-coat method using an inorganic silicon oxide glass (SOG) material has made it possible to form an insulation film offering a low dielectric constant $\epsilon$ of approx. 2.3.

Also, the plasma CVD method, when CxFyHz is used as a material gas, has enabled the formation of a fluorinated amorphous carbon film with a low dielectric constant $\epsilon$ of 2.0 to 2.4. When a silicon hydrocarbon (such as P-TMOS (phenyl trimethoxy silane)) is used as a material gas, on the other hand, the plasma CVD method has been shown to form an insulation film with a low dielectric constant $\epsilon$ of 3.1. Furthermore, it has been made possible to form an insulation film with a low dielectric constant $\epsilon$ of approx. 2.5 under the plasma CVD method when a silicon hydrocarbon containing multiple alkoxyl groups is used as a material gas and the film forming conditions are optimized.

In addition, U.S. Pat. No. 6,846,515 describes a method for forming an insulation film of low dielectric constant using a porogen gas, wherein the deposited insulation film is cured to create pores in the film.

SUMMARY OF THE INVENTION

However, the conventional approaches mentioned above present the problems described below.

First, in the case of an inorganic SOG insulation film formed by the spin-coat method, the material is not evenly distributed over the silicon substrate, and the apparatus used in the curing process that takes place after the material has been applied is expensive.

Also, a fluorinated amorphous carbon film formed by the plasma CVD method using CxFyHz as a material gas has the drawbacks of the film exhibiting low heat resistance (370° C. or below), poor adhesion with silicon materials, and low mechanical strength.

If P-TMOS, which contains three alkoxyl groups, is selected from among the various silicon hydrocarbons, on the other hand, the polymerized oligomer is unable to form a linear structure like the one demonstrated by siloxane. As a result, a porous structure cannot be formed on the silicon substrate and the dielectric constant cannot be reduced to a desired level.

Furthermore, use of a silicon hydrocarbon containing multiple alkoxyl groups as a material gas is not without problem, either, although it allows the polymerized oligomer, through optimization of conditions, to form a linear structure like the one demonstrated by siloxane and therefore enables the formation of a porous structure on the silicon substrate and consequently the dielectric constant can be reduced to a desired level. The drawback of this method is that the weak binding power between oligomer molecules in the linear structure results in lower mechanical strength of the film.

In the meantime, U.S. Pat. No. 6,846,515 describes a method for forming an insulation film of low dielectric constant by using a porogen gas, wherein the deposited insulation film is cured to create pores in the film. However, this method does not use any oxidizing gas and the relationship between the flow rate ratio of reacting gases and the dielectric constant of an achieved film is not described. Accordingly, this method is insufficient for use in actual film forming processes.

The present invention was developed in light of the problems described above. An embodiment of the present invention provides a method for forming an insulation film of low dielectric constant by specifying a flow rate ratio of reactant gases.

In an embodiment, the purpose of the present invention is to provide a method for forming an insulation film of low dielectric constant easily without increasing the apparatus cost.

To solve at least one of the problems mentioned above, an embodiment of the present invention provides a method for forming an insulation film of low dielectric constant consisting of the steps specified below. To be specific, the method for forming an insulation film of low dielectric constant using the plasma CVD method according to an embodiment of the present invention comprises a step in which a material gas constituted by a silicon hydrocarbon containing multiple crosslinkable groups such as alkoxyl groups and/or vinyl groups, is introduced to a reaction chamber along with a porogen gas, oxidizing gas, and inert gas, a step in which the first RF power and second RF power are superimposed onto each other to apply the superimposed power, or apply only the first RF power, to generate a plasma reaction field in the reaction chamber, and a step in which the dielectric constant of the cured insulation film is controlled using specific parameters based on gas flow rates.

As for the material gas constituted by a silicon hydrocarbon containing multiple crosslinkable groups, in an embodiment of the present invention a compound containing one or more crosslinkable groups can be used alone or combined with a different compound containing one or more crosslinkable groups or with other silicon hydrocarbon. In an embodiment of the present invention, the porogen gas is a hydrocarbon having a linear or cyclic structure and expressed by the general chemical formula CnHm, wherein n is selected from the group of 4 to 14 while m is selected from the group of 4 to 30, and wherein the specific ingredient is selected from the group consisting of α-terpinene, hexane and cyclohexane. In an embodiment of the present invention, the oxidizing gas is selected from the group consisting of $O_2$ and $N_2O$. In an embodiment of the present invention, the inert gas is any one of He, Ar, Kr and Xe or any combination thereof. These gases have different ionizing energy levels and collision cross-section areas, respectively, and therefore use of a different combination of these gases makes it possible to control the reaction occurring in the vapor phase.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

The present invention will be explained in detail with respect to preferred embodiments. The preferred embodiments are not intended to limit the present invention.

In an embodiment of the present invention, a method for reducing a dielectric constant of a cured film may preferably comprise: (a) introducing a source gas at a flow rate of A, a porogen gas at a flow rate of B, an oxidizing gas at a flow rate of C, and an inert gas into a reaction space in which a substrate is place, said source gas being a silicon-containing hydrocarbon compound having multiple cross linkable groups, said porogen gas being a gas constituted by a porogen material; (b) increasing a ratio of B/(A+B) used as a parameter for controlling a dielectric constant of a cured film, by a degree substantially or nearly in proportion to a target decrease of dielectric constant of a cured film; (c) applying RF power to the reaction space, thereby depositing a film on the substrate by plasma CVD; and (d) curing the film to remove the porogen material, thereby forming pores in the cured film. In the above, in an embodiment, the porogen is generally non-reactive with a film-forming precursor and is decomposed and removed from a film when the film is heated or cured, thereby forming a porous structure in the film. In the above, surprisingly, the dielectric constant of the cured film can be controlled substantially or nearly proportionally by a parameter B/(A+B) (preferably as a single parameter) in the presence of an oxidizing gas, and thus, controllability or operability can significantly be improved.

In the above, in an embodiment, the ratio of B/(A+B) may preferably be controlled in the range of 0.30-0.70, and the oxidizing gas may be used to satisfy C/(A+B+C)=0.09-0.18, whereby as a result of the curing, the cured film has a dielectric constant of 2.4-2.7. In the above embodiment, the cured film may have an elastic modulus of 6 GPa to 14 GPa in an embodiment. In the above embodiment, the dielectric constant of the pre-cured film (or the deposited film) may be 2.85-3.0 (e.g., 2.87) in an embodiment. In another embodiment, the ratio of B/(A+B) may preferably be controlled in the range of 0.70-0.85, and the oxidizing gas may be used to satisfy C/(A+B+C)=0.05-0.09, whereby as a result of the curing, the cured film has a dielectric constant of 2.1-2.4. In the above embodiment, the cured film may have an elastic modulus of 3 GPa to 6 GPa in an embodiment. In the above embodiment, the dielectric constant of the pre-cured film (or the deposited film) may be 2.75-2.9 (e.g., 2.80) in an embodiment. In an embodiment, the thickness of the deposited film may be 50 nm to 1,000 nm (e.g., 100 nm to 600 nm), depending on its intended use.

In an embodiment, in the case of a substrate having a diameter of 300 mm, the flow rate of A may be 40 sccm to 150 sccm, preferably 50 sccm to 120 sccm; the flow rate of B may be 20 sccm to 400 sccm, preferably 30 sccm to 320 sccm; and the flow rate of C may be 10 sccm to 100 sccm, preferably 15 sccm to 50 sccm. In an embodiment, in the case of a substrate having a diameter of 200 mm, the above flow rates may be reduced to 1/3 to 1/1.5 (e.g., 1/2) of the above flow rates.

In the present disclosure, the numerical numbers such as above applied in embodiments can be modified by ±50% in other embodiments, and the ranges applied in embodiments may include or exclude the endpoints.

In any of the foregoing embodiments, the ratio of B/(A+B) may preferably be used as a single parameter for controlling a dielectric constant of the cured film.

In any of the foregoing embodiments, the porogen gas may preferably be constituted by at least one porogen material selected from the group consisting of straight-chain or branched or cyclic hydrocarbons having a formula $C_nH_m$ wherein n is 4-14, and m is 4-30. In an embodiment, the porogen material may preferably be saturated or unsaturated aromatic or alphatic hydrocarbon having C6-10.

In any of the foregoing embodiments, the porogen material may preferably be selected from the group consisting of α-terpinene, β-terpinene, γ-terpinene, cyclohexane, and hexane. In an embodiment, the porogen gas may preferably be constituted by α-terpinene, β-terpinene, or γ-terpinene.

In any of the foregoing embodiments, the reaction space for depositing the film may preferably be controlled at a temperature of higher than 200° C. but lower than 350° C. which is higher than boiling points of the porogen materials. In an embodiment, the temperature may preferably be 250° C. to 325° C.

In any of the foregoing embodiments, the method may further comprise, prior to the step of introducing gases: establishing a relationship between B/(A+B) and dielectric constant of a cured film, which is substantially or nearly a linear inverse relationship, by: (i) introducing a source gas at a flow rate of A, a porogen gas at a flow rate of B, an oxidizing gas, and an inert gas into a reaction space in which a substrate is place, said source gas being a silicon-containing hydrocarbon compound having multiple cross linkable groups, said porogen gas being a gas constituted by a porogen material; (ii) changing a ratio of B/(A+B) used as a parameter for controlling a dielectric constant of a cured film; (iii) applying RF power to the reaction space, thereby depositing a film on the substrate by plasma CVD; (iv) curing the film to remove the porogen material, thereby forming pores in the film; and (v) repeating steps (i) to (iv), wherein in the step of increasing the ratio of B/(A+B), the ratio of B/(A+B) is determined according to a target decrease of dielectric constant of the cured film based on the established relationship.

In any of the foregoing embodiments, the cross linkable groups of the source gas may preferably be alkoxyl group and/or vinyl group. In an embodiment, the source gas may be constituted by compounds having a formula $Si_\alpha O_{\alpha-1} R_{2\alpha-\beta+2} (OC_n H_{2n+1})_\beta$ wherein $\alpha$ is an integer of 1-3, $\beta$ is an integer of 2 or 3, n is an integer of 1-3, R is attached to Si has C1-12. In an embodiment, a may be 1 or 2, and $\beta$ may be 2. In an embodiment, the R in the source gas may be attached to Si and selected from the group consisting of a hydrocarbon of C1-12, fluoride hydrocarbon of C1-12, perfluorine hydrocarbon, H, D, F, Cl, Br, and I. In an embodiment, the source gas may be a hydrocarbon of C1-6. In an embodiment, the source gas may be selected from the group consisting of diethoxymethylsilane, dimethyldimethoxysilane, 1,3-dimethoxytetramethyldisiloxane, and 1,3-divinyltetramethyldisiloxane.

In any of the foregoing embodiments, the oxidizing gas may preferably be $O_2$ and/or $N_2O$.

In any of the foregoing embodiments, the inert gas may be Ne, He, and/or Ar. In any of the foregoing embodiments, the inert gas may be introduced at a flow rate which is 5 times to 30 times (in an embodiment, 10 times to 20 times) greater than the flow rate of the source gas.

The RF power may preferably have a single frequency (in another embodiment, a mixture of multiple frequencies). In an embodiment, the frequency may be 2 MHz or higher such as 10-30 MHz. The RF power may be 0.5 W/cm$^2$ to 2.5 W/cm$^2$ (in an embodiment, 1.0 W/cm$^2$ to 2.0 W/cm$^2$).

In any of the foregoing embodiments, the curing step may be performed at a temperature of 0° C. to 550° C. (in an embodiment, 100° C. to 450° C., in another embodiment, 200° C. to 400° C.). The curing step can be performed by heat annealing, UV irradiation, or electron beam irradiation. In an embodiment, the curing step may be conducted until the porogen material is substantially or nearly or significantly removed, e.g., for 120 seconds to 3600 seconds.

In another embodiment of the present invention, a method for forming a film having a low dielectric constant may comprise: (I) introducing a source gas at a flow rate of A, a porogen gas at a flow rate of B, an oxidizing gas at a flow rate of C, and an inert gas into a reaction space in which a substrate is place, said source gas being a silicon-containing hydrocarbon compound having multiple cross linkable groups, said porogen gas being a gas constituted by a porogen material selected from the group consisting of α-terpinene, β-terpinene, γ-terpinene, cyclohexane, and hexane, wherein B/(A+B) is 0.30-0.70 when C/(A+B+C) is 0.09-0.18, or B/(A+B) is 0.70-0.85 when C/(A+B+C) is 0.05-0.09; (II) applying RF power to the reaction space, thereby depositing a film on the substrate by plasma CVD; and (III) curing the film to remove the porogen material, thereby forming pores in the cured film.

In the above, any of the foregoing embodiments can be applied in any combination. Further, in an embodiment, in the step of introducing gases, B/(A+B) may be 0.30-0.70, and C/(A+B+C) may be 0.09-0.18, and as a result of the curing, the cured film may have a dielectric constant of 2.4-2.7. In another embodiment, in the step of introducing gases, B/(A+B) may be 0.70-0.85, and C/(A+B+C) may be 0.05-0.09, and as a result of the curing, the cured film has a dielectric constant of 2.1-2.4.

In still another embodiment of the present invention, a method for controlling a dielectric constant of a cured film may comprise: (i) introducing a source gas at a flow rate of A, a porogen gas at a flow rate of B, an oxidizing gas, and an inert gas into a reaction space in which a substrate is place, said source gas being a silicon-containing hydrocarbon compound having multiple cross linkable groups, said porogen gas being a gas constituted by a porogen material; (ii) changing a ratio of B/(A+B) used as a parameter for controlling a dielectric constant of a cured film; (iii) applying RF power to the reaction space, thereby depositing a film on the substrate by plasma CVD; (iv) curing the film to remove the porogen material, thereby forming pores in the film; (v) repeating steps (i) to (iv) to establish a relationship between B/(A+B) and dielectric constant of the cured film, which is substantially or nearly a linear inverse relationship; and (vi) performing steps (i) to (iv) for a new substrate wherein in step (ii), the ratio of B/(A+B) is determined according to a target decrease of dielectric constant of a cured film based on the relationship established in step (v).

In the above, any of the foregoing embodiments can be applied in any combination.

In the present disclosure where conditions and/or structures are not specified, the skilled artisan in the art can readily provide such conditions and/or structures, in view of the present disclosure, as a matter of routine experimentation. For example, the disclosure of U.S. Patent Publication No. 2007/0009673 A1 can be applied to embodiments and is herein incorporated by reference in its entirety.

The present invention will be explained in detail with respect to drawings and examples. However, the drawings and the examples are not intended to limit the present invention.

The apparatus structure, as well as the improvements achieved by the present invention, are explained below by using examples of using the apparatus.

Figure 1:
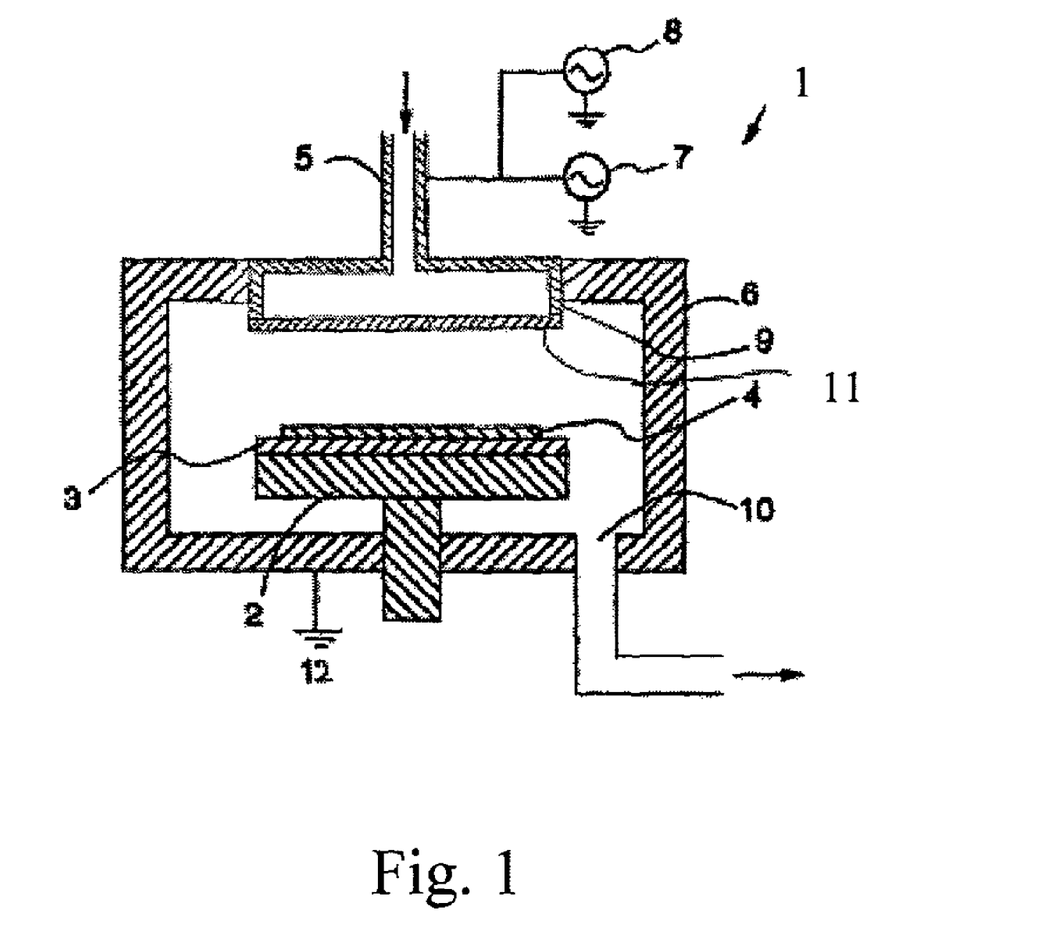
FIG. 1 is a schematic diagram of a plasma CVD apparatus usable in an embodiment of the present invention.

FIG. 1 is a schematic diagram of a plasma CVD apparatus usable under the present invention. This plasma CVD apparatus 1 consists of a reaction chamber 6, gas introduction port 5, susceptor 3, and second electrode constituted by a heater 2. Gases are introduced from the gas introduction port 5 through gas lines not illustrated in the figure. A first electrode 9 of circular shape is positioned just below the gas introduction port 5, where the first electrode 9 has a hollow structure, provides many pores in its bottom face, and gases are released through these pores toward a processing target 4. To allow for easy maintenance and reduce parts cost, the first electrode 9 is also structured in such a way that a shower plate 11 having multiple gas introduction holes can be replaced.

Provided at the bottom of the reaction chamber 6 is an exhaust port 10. This exhaust port 10 is connected to an external vacuum pump not illustrated in the figure, and the interior of the reaction chamber 6 is evacuated by means of this pump. The susceptor 3 is positioned in parallel with and directly facing the first electrode 9. The susceptor 3 retains a processing target 4 on top, heats the processing target 4 continuously using the heater 2, and thereby maintains the substrate 4 at a specified temperature (0 to 500° C.). The gas introduction port 5 and first electrode 9 are insulated from the reaction chamber 6, and connected to a first RF power supply 7 provided externally. A second RF power supply 8 may be connected, as well. 12 indicates a grounding point. The first electrode 9 and second electrode thus function as RF electrodes to generate a plasma reaction field near the processing target 4. The type and thickness of the film formed over the surface of the processing target 4 change according to the type and flow rate of the material gas, temperature, RF frequency type, spatial distribution of plasma, and distribution of electric potential.

EXAMPLES

Controllability of the dielectric constant of the cured insulation film by means of the flow rate of each gas was verified for methods for forming an insulation film of low dielectric constant according to the present invention.

(Experiment 1)

An experiment was conducted in which an insulation film was formed on a silicon substrate of 300 mm in diameter using the plasma CVD apparatus 1 shown in FIG. 1.

Figure 2:
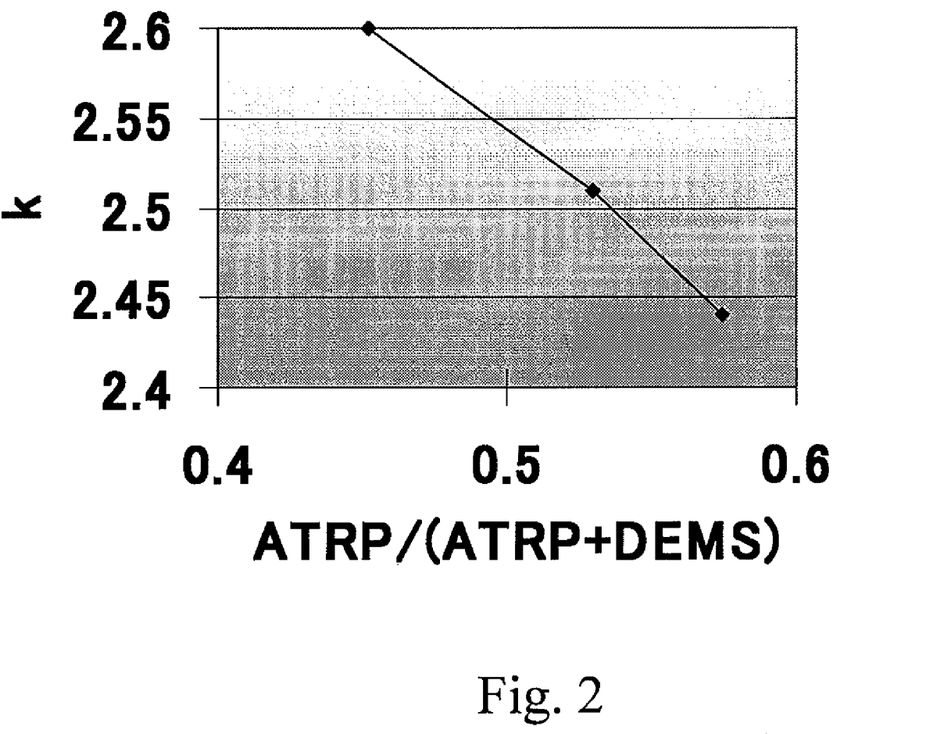
FIG. 2 is a graph showing the relationship between dielectric constant of a cured film and a flow ratio of porogen gas/(porogen gas+source gas) according to an embodiment of the present invention.

Conditions for experiment
A: Material gas: DEMS (diethoxy methyl silane), 73 to 75 sccm
B: Porogen gas: ATRP (α-terpinene), 60 to 100 sccm
C: Oxidizing gas: $O_2$, 25 sccm
D: Inert gas: He, 750 sccm
First RF power supply: 13.56 MHz, 1.0 W/cm$^2$
Film forming temperature: 300° C.
Film forming pressure: 960 Pa
Film thickness: 500 nm
Curing method: UV (high-pressure mercury lamp)
Power: 90 mW/cm$^2$
Curing temperature: 400° C.
Curing time: 900 sec FIG. 2 shows the relationship between the dielectric constant k of an obtained insulation film of low dielectric constant and the mixing ratio of reactant gases B/(A+B). As shown, the relationship approximates an inverse linear function. In addition to this example of experiment, in an embodiment of the present invention the value of B/(A+B) is in a range of 0.4 to 0.6 (as a reference, the value of C/(A+B+C) is in a range of 0.12 to 0.16) and the dielectric constant is in a range of 2.4 to 2.6. The specific values of A, B, B/A+B), C/(A+B+C) and k at each point in the graph are shown in Table 1.

TABLE 1

| A (sccm) DEMS | B (sccm) ATRP | B/(A + B) | C/(A + B + C) | K |
|---|---|---|---|---|
| 74.8 | 61.5 | 0.451 | 0.155 | 2.60 |
| 73.1 | 82.2 | 0.529 | 0.139 | 2.51 |
| 73.1 | 98.6 | 0.574 | 0.127 | 2.44 |

(Experiment 2)

An experiment was conducted in which an insulation film was formed on a silicon substrate of 300 mm in diameter using the plasma CVD apparatus 1 shown in FIG. 1.

Figure 3:
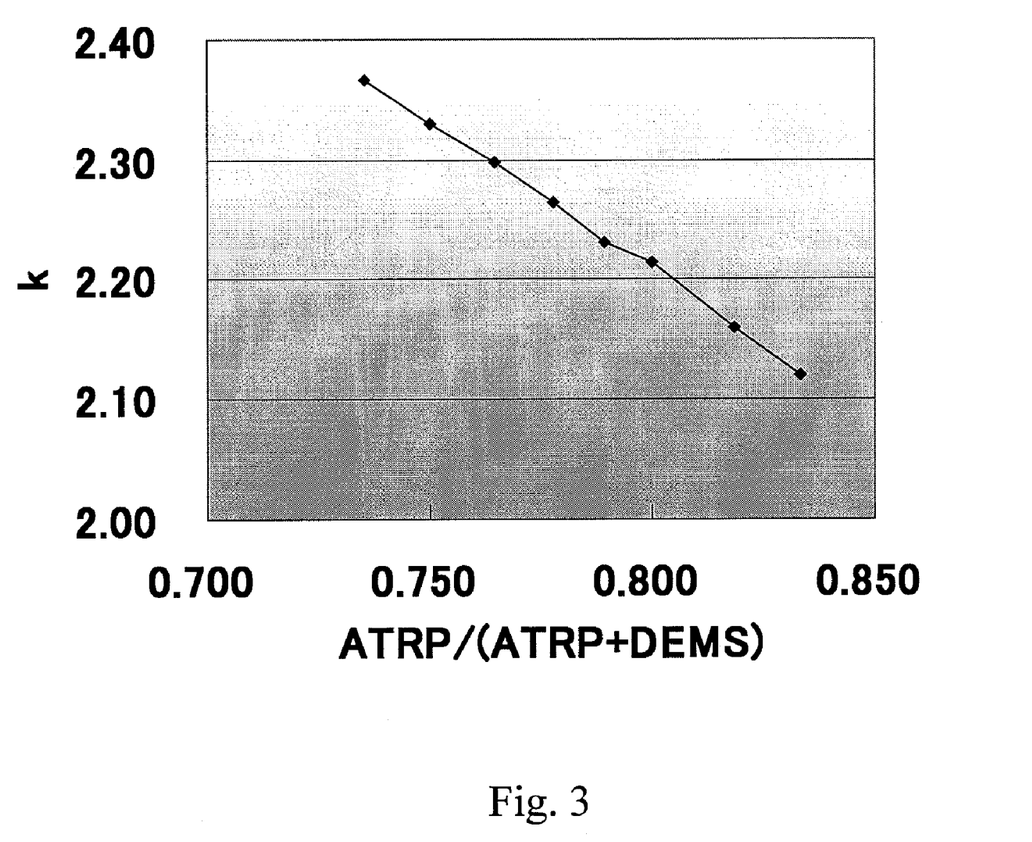
FIG. 3 is a graph showing the relationship between dielectric constant of a cured film and a flow ratio of porogen gas/(porogen gas+source gas) according to another embodiment of the present invention.

Conditions for experiment
A: Material gas: DEMS (diethoxy methyl silane), 60 to 100 sccm
B: Porogen gas: ATRP (α-terpinene), 270 to 310 sccm
C: Oxidizing gas: $O_2$, 25 sccm
D: Inert gas: He, 750 sccm
First RF power supply: 13.56 MHz, 1.0 W/cm$^2$
Film forming temperature: 300° C.
Film forming pressure: 800 Pa
Film thickness: 500 nm
Curing method: UV (high-pressure mercury lamp)
Power: 90 mW/cm$^2$
Curing temperature: 400° C.
Curing time: 900 sec FIG. 3 shows the relationship between the dielectric constant k of an obtained insulation film of low dielectric constant and the mixing ratio of reactant gases B/(A+B). As shown, the relationship approximates an inverse linear function. In addition to this example of experiment, in an embodiment of the present invention the value of B/(A+B) is in a range of 0.7 to 0.85 (as a reference, the value of C/(A+B+C) is in a range of 0.06 to 0.07) and the dielectric constant is in a range of 2.1 to 2.4. The specific values of A, B, B/A+B), C/(A+B+C) and k at each point in the graph are shown in Table 2.

TABLE 2

| A (sccm) DEMS | B (sccm) ATRP | B/(A + B) | C/(A + B + C) | K |
|---|---|---|---|---|
| 97.5 | 270.6 | 0.735 | 0.064 | 2.37 |
| 92.0 | 276.1 | 0.750 | 0.064 | 2.33 |
| 86.6 | 281.5 | 0.765 | 0.064 | 2.30 |
| 81.8 | 286.3 | 0.778 | 0.064 | 2.27 |
| 77.5 | 290.6 | 0.789 | 0.064 | 2.23 |
| 73.6 | 294.5 | 0.800 | 0.064 | 2.21 |
| 66.9 | 301.2 | 0.818 | 0.064 | 2.16 |
| 61.4 | 306.8 | 0.833 | 0.064 | 2.12 |

(Experiment 3)

An experiment was conducted in which an insulation film was formed on a silicon substrate of 300 mm in diameter using the plasma CVD apparatus 1 shown in FIG. 1.

Figure 4:
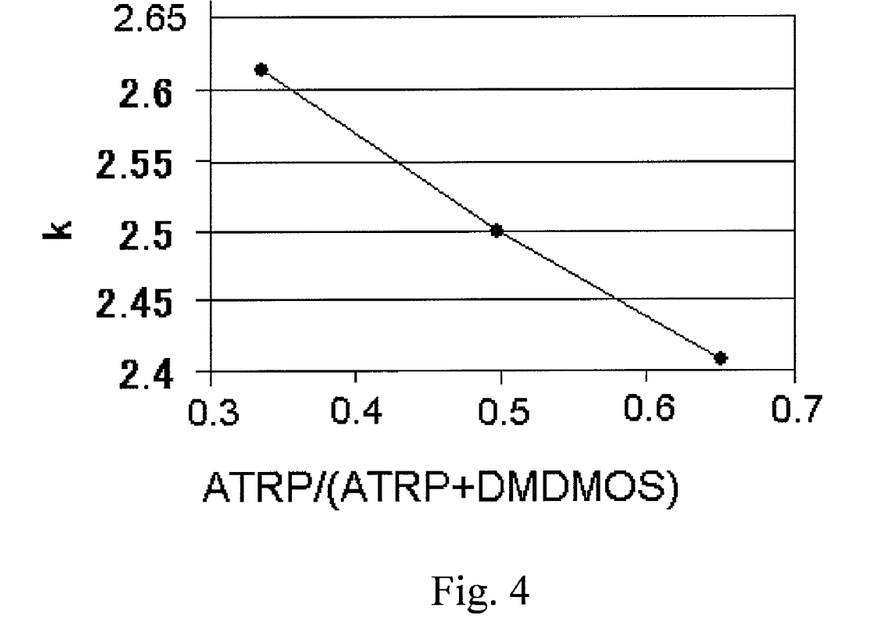
FIG. 4 is a graph showing the relationship between dielectric constant of a cured film and a flow ratio of porogen gas/(porogen gas+source gas) according to still another embodiment of the present invention.

Conditions for experiment
A: Material gas: DMDMOS (dimethyldimethoxysilane), 80 sccm
B: Porogen gas: ATRP (α-terpinene), 40 to 160 sccm
C: Oxidizing gas: $O_2$, 25 sccm
D: Inert gas: He, 750 sccm
First RF power supply: 27.12 MHz, 1.8 W/cm$^2$
Film forming temperature: 300° C.
Film forming pressure: 850 Pa
Film thickness: 500 nm
Curing method: UV (high-pressure mercury lamp)
Power: 90 mW/cm$^2$
Curing temperature: 400° C.
Curing time: 900 sec FIG. 4 shows the relationship between the dielectric constant k of an obtained insulation film of low dielectric constant and the mixing ratio of reactant gases B/(A+B). As shown, the relationship approximates an inverse linear function. In addition to this example of experiment, in an embodiment of the present invention the value of B/(A+B) is in a range of 0.3 to 0.7 (as a reference, the value of C/(A+B+C) is in a range of 0.09 to 0.18) and the dielectric constant is in a range of 2.4 to 2.7. The specific values of A, B, B/A+B), C/(A+B+C) and k at each point in the graph are shown in Table 3.

TABLE 3

| A (sccm) DMDMOS | B (sccm) ATRP | B/(A + B) | C/(A + B + C) | K |
|---|---|---|---|---|
| 80 | 40 | 0.33 | 0.172 | 2.62 |
| 80 | 80 | 0.5 | 0.135 | 2.50 |
| 80 | 160 | 0.66 | 0.094 | 2.41 |

In the above, the numerical numbers indicating the conditions and the results in the examples can be modified by ±50% in other embodiments, and the ranges applied in the examples may include or exclude the endpoints.

As explained above, the dielectric constant of an insulation film of low dielectric constant can be controlled by means of the mixing ratio of gases including the material gas based on their flow rates, according to the method for forming an insulation film of low dielectric constant given by an embodiment of the present invention. In the method for forming an insulation film of low dielectric constant given by another embodiment of the present invention, an insulation film of low dielectric constant can be formed easily without increasing the apparatus cost.

The present invention includes the above mentioned embodiments and other various embodiments including the following:

1) A method for forming a silicon insulation film on a substrate, comprising a step in which a material gas constituted by a silicon hydrocarbon compound containing multiple crosslinkable groups A is introduced to a reaction chamber in which a substrate is placed, along with reactant gases including a porogen gas B, oxidizing gas C and inert gas D, a step in which RF power is applied to generate a plasma reaction field in the reaction chamber, a step in which the flow rates of reactant gases and intensity of RF power are controlled to deposit a film, and a step in which the deposited film is cured to form pores in the film, wherein said method is characterized by forming an insulation film with a dielectric constant of 2.4 to 2.6 by controlling the flow rate ratios of reactant gases to a range of 0.4 to 06 for B/(A+B) and a range of 0.10 to 0.15 for C/(A+B+C).

2) A method for forming a silicon insulation film on a substrate, consisting of a step in which a material gas constituted by a silicon hydrocarbon compound containing multiple crosslinkable groups A is introduced to a reaction chamber in which a substrate is placed, along with reactant gases including a porogen gas B, oxidizing gas C and inert gas D, a step in which RF power is applied to generate a plasma reaction field in the reaction chamber, a step in which the flow rates of reactant gases and intensity of RF power are controlled to deposit a film, and a step in which the deposited film is cured to form pores in the film, wherein said method is characterized by forming an insulation film with a dielectric constant of 2.1 to 2.4 by controlling the flow rate ratios of reactant gases to a range of 0.70 to 0.85 for B/(A+B) and a range of 0.05 to 0.10 for C/(A+B+C).

3) A method according to 1) or 2) above, wherein the crosslinkable groups contained in the silicon hydrocarbon compound are alkoxyl groups and/or vinyl groups.

4) A method according to 1) or 2) above, wherein the porogen gas is constituted by at least one hydrocarbon having a linear or cyclic structure and expressed by the general formula CnHm, wherein n is selected from the group of 4 to 14 while m is selected from the group of 4 to 30.

5) A method according to 23) above, wherein the porogen gas is constituted by at least one gas selected from the group consisting of α-terpinene, hexane and cyclohexane.

6) A method according to 3) above, wherein the material gas is constituted by at least one compound expressed by the chemical formula $Si_\alpha O_{\alpha-1} R_{2\alpha-\beta+2}(OC_n H_{2n+1})_\beta$, where α is an integer of 1 to 3, β is 2 or 3, and n is an integer of 1 to 3. R is bonded to Si and selected from the group consisting of hydrocarbons of $C_1$ to $_{12}$, fluorinated hydrocarbons of $C_1$ to $_{12}$, perfluorinated hydrocarbons of $C_1$ to $_{12}$, H, D, F, Cl, Br and I, where if multiple Rs are used, then each R can be selected independently from the aforementioned group and each R may be the same as or different from any other R. In an embodiment of the present invention, H is always contained in the material gas molecule.

7) A method according to 6) above, wherein α is 1 or 2, while β is 2.

8) A method according to 7) above, wherein the material gas is diethoxy methyl silane.

9) A method according to 6) above, wherein R is a hydrocarbon of $C_1$ to $_6$.

10) A method according to 9) above, wherein the material gas is dimethyldimethoxysilane.

11) A method according to 6) above, wherein the material gas is 1,3-dimethoxytetramethyldisiloxane.

12) A method according to 3) above, wherein the material gas is 1,3-divinyltetramethyldisiloxane.

13) A method according to 1) or 2) above, wherein the RF power has a single frequency.

14) A method according to 13) above, wherein the frequency is 2 MHz or above.

15) A method according to 13) above, wherein the frequency is between 10 and 30 MHz.

16) A method according to 1) or 2) above, wherein the inert gas is at least one gas selected from the group consisting of Ar, Ne and He.

17) A method according to 1) or 2) above, wherein the oxidizing gas is at least one gas selected from the group consisting of $O_2$ and $N_2O$.

18) A method according to 1) or 2) above, wherein the intensity of RF power is between 0.5 $W/cm^2$ and 2.0 $W/cm^2$.

19) A method according to 1) or 2) above, wherein the inert gas is supplied at a flow rate of 5 to 30 times the flow rate of the material gas.

20) A method according to 1) or 2) above, wherein curing is implemented by means of hot annealing, UV irradiation or electron beam irradiation.

21) A method according to 1) or 2) above, wherein the curing is implemented at temperatures of 0 to 450° C.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for obtaining process parameters for controlling a dielectric constant of a cured film, comprising:
   (i) introducing only a source gas at a flow rate of A, a porogen gas at a flow rate of B, an oxidizing gas at a flow rate of C, and an inert gas into a reaction space in which a substrate is placed, said source gas consisting of a silicon-containing hydrocarbon compound having multiple cross linkable groups including one or more alkoxyl groups, said porogen gas being a gas constituted by a porogen material, C being no less than 10 sccm but less than 50 sccm, wherein a ratio of B/(A+B) is used as a parameter for controlling a dielectric constant of a cured film, and is between 0.70 and 0.85;
   (ii) applying RF power to the reaction space, thereby depositing a film on the substrate by plasma CVD;
   (iii) curing the film to remove the porogen material, thereby forming pores in the cured film having a dielectric constant k1;
   (iv) repeating steps (i) to (iii) by changing the ratio of B/(A+B) between 0.70 and 0.85 by an amount R, thereby obtaining a cured film having a dielectric constant k2; and
   (v) repeating steps (i) to (iii) by changing the ratio of B/(A+B) between 0.70 and 0.85 at a rate of R/(k1−k2) to obtain a cured film having a target dielectric constant, thereby obtaining process parameters for the target dielectric constant.

2. The method according to claim 1, wherein the oxidizing gas is used to satisfy C/(A+B+C)=0.05-0.09, whereby as a result of the curing, the cured film has a dielectric constant of 2.1-2.4.

3. The method according to claim 1, wherein the porogen gas is constituted by at least one porogen material selected from the group consisting of straight-chain or branched or cyclic hydrocarbons having a formula $C_nH_m$ wherein n is 4-14, and m is 4-30.

4. The method according to claim 1, wherein the porogen material is selected from the group consisting of α-terpinene, β-terpinene, γ-terpinene, cyclohexane, and hexane.

5. The method according to claim 4, wherein the porogen gas is constituted by α-terpinene, β-terpinene, or γ-terpinene.

6. The method according to claim 1, wherein the reaction space for depositing the film is controlled at a temperature of higher than 200° C. but lower than 350° C.

7. The method according to claim 1, wherein the source gas is constituted by at least one compound having a formula $Si_\alpha O_{\alpha-1} R_{2\alpha-\beta+2}(OC_nH_{2n+1})_\beta$ wherein α is an integer of 1-3, β is an integer of 2 or 3, n is an integer of 1-3, R is attached to Si and is H or has C1-12.

8. The method according to claim 7, wherein α is 1 or 2, and β is 2.

9. The method according to claim 1, wherein the oxidizing gas is $O_2$ and/or $N_2O$.

10. The method according to claim 1, wherein the inert gas is Ne, He, Kr, Xe, and/or Ar.

11. The method according to claim 1, wherein the inert gas is introduced at a flow rate which is 5 times to 30 times greater than the flow rate of the source gas.

12. The method according to claim 1, wherein the curing step is performed at a temperature of 0° C. to 450° C.

13. The method according to claim 1, wherein the source gas is selected from the group consisting of diethoxymethylsilane, dimethyldimethoxysilane, and 1,3-dimethoxytetramethyldisiloxane.

14. A method for forming a cured film having a low dielectric constant, the method comprising:
   obtaining process parameters for a target dielectric constant of a cured film according to claim 1;
   forming a film on a substrate using the process parameters; and
   curing the film to obtain a cured film having the target dielectric constant, thereby obtaining process parameters for the target dielectric constant.

15. A method for obtaining process parameters for controlling a dielectric constant of a cured film, comprising:
   (i) introducing only a source gas at a flow rate of A, a porogen gas at a flow rate of B, an oxidizing gas at a flow rate of C, and an inert gas into a reaction space in which a substrate is placed, said source gas consisting of a silicon-containing hydrocarbon compound having multiple cross linkable groups including one or more alkoxyl groups, said porogen gas being a gas constituted by a porogen material, C being no less than 10 sccm but less than 50 sccm, wherein a ratio of B/(A+B) is used as a parameter for controlling a dielectric constant of a cured film and is between 0.30 and 0.70;
   (ii) applying RF power to the reaction space, thereby depositing a film on the substrate by plasma CVD;
   (iii) curing the film to remove the porogen material, thereby forming pores in the cured film having a dielectric constant k1;
   (iv) repeating steps (i) to (iii) by changing the ratio of B/(A+B) between 0.30 and 0.70 by an amount R, thereby obtaining a cured film having a dielectric constant k2; and
   (v) repeating steps (i) to (iii) by changing the ratio of B/(A+B) between 0.30 and 0.70 at a rate of R/(k1−k2) to obtain a cured film having a target dielectric constant, thereby obtaining process parameters for the target dielectric constant.

16. The method according to claim 15, wherein the oxidizing gas is used to satisfy C/(A+B+C)=0.09-0.18, whereby as a result of the curing, the cured film has a dielectric constant of 2.4-2.7.

17. A method for forming a cured film having a low dielectric constant, the method comprising:
   obtaining process parameters for a target dielectric constant of a cured film according to claim 15;
   forming a film on a substrate using the process parameters; and
   curing the film to obtain a cured film having the target dielectric constant.

\* \* \* \* \*

UNITED STATES PATENT AND TRADEMARK OFFICE
CERTIFICATE OF CORRECTION

PATENT NO.         : 7,955,650 B2
APPLICATION NO.    : 11/759439
DATED              : June 7, 2011
INVENTOR(S)        : Naoto Tsuji It is certified that error appears in the above-identified patent and that said Letters Patent is hereby corrected as shown below:

In column 9, line 47, please replace "23)" with --3)--

In claim 1, column 10, line 46, please replace "seem" with --sccm--

Signed and Sealed this
Eighteenth Day of September, 2012

David J. Kappos
*Director of the United States Patent and Trademark Office*